United States Patent [19]
Cabral, Jr. et al.

[11] Patent Number: 5,634,973
[45] Date of Patent: Jun. 3, 1997

[54] LOW TEMPERATURE SELECTIVE GROWTH OF SILICON OR SILICON ALLOYS

[75] Inventors: Cyril Cabral, Jr., Ossining; Kevin K. Chan, Staten Island; Jack O. Chu, Astoria; James M. E. Harper, Yorktown Heights, all of N.Y.

[73] Assignee: International Business Machines Corporation, Armonk, N.Y.

[21] Appl. No.: 587,029

[22] Filed: Jan. 16, 1996

Related U.S. Application Data

[62] Division of Ser. No. 469,650, Jun. 6, 1995, which is a division of Ser. No. 390,132, Feb. 17, 1995, Pat. No. 5,565,031, which is a division of Ser. No. 240,060, May 9, 1994, Pat. No. 5,427,630.

[51] Int. Cl.[6] ................................ C30B 33/06
[52] U.S. Cl. ...................... 117/95; 117/83; 438/945; 438/488
[58] Field of Search ...................... 117/2, 83, 88, 117/95; 427/82; 437/89

[56] References Cited

U.S. PATENT DOCUMENTS

| | | | |
|---|---|---|---|
| 3,206,339 | 9/1965 | Thornton | 117/95 |
| 3,663,870 | 5/1972 | Tsutsumi et al. | 370/85.11 |
| 4,350,729 | 9/1982 | Nakano et al. | |
| 4,479,297 | 10/1984 | Mizutani et al. | 437/21 |
| 4,495,219 | 1/1985 | Kato et al. | 437/235 |
| 4,526,629 | 7/1985 | Latta et al. | 437/235 |
| 4,661,176 | 4/1987 | Manasevit | 117/88 |
| 5,181,964 | 1/1993 | Meyerson | 118/719 |
| 5,227,330 | 7/1993 | Agnello et al. | 428/209 |
| 5,262,348 | 11/1993 | Pribat et al. | 437/108 |
| 5,298,452 | 3/1994 | Meyerson | 437/89 |

Primary Examiner—Felisa Garrett
Attorney, Agent, or Firm—Ratner & Prestia

[57] ABSTRACT

Epitaxial and polycrystalline layers of silicon and silicon-germanium alloys are selectively grown on a semiconductor substrate or wafer by forming over the wafer a thin film masking layer of an oxide of an element selected from scandium, yttrium, lanthanum, cerium, praseodymium, neodymium, samarium, europium, gadolinium, terbium, dysprosium, holmium, erbium, thulium, ytterbium, and lutetium; and then growing the epitaxial layer over the wafer at temperatures below 650° C. The epitaxial and polycrystalline layers do not grow on the masking layer. The invention overcomes the problem of forming epitaxial layers at temperatures above 650° C. by providing a lower temperature process.

6 Claims, 6 Drawing Sheets

FIG. 6A
AS DEPOSITED

FIG. 6B
AFTER HCl:H₂O etch

LOW TEMPERATURE SELECTIVE GROWTH OF SILICON OR SILICON ALLOYS

This application is a division of application Ser. No. 08/469,650, filed Jun. 6, 1995, which is a division of grandparent application Ser. No. 08/390,132, filed Feb. 17, 1995, now U.S. Pat. No. 5,565,031, which in turn is a division of great grandparent application Ser. No. 08/240,060, filed May 9, 1994, now U.S. Pat. No. 5,427,630.

FIELD OF THE INVENTION

The present invention relates to semiconductor devices, and more particularly, to masking materials for low temperature selective growth of epitaxial layers.

BACKGROUND OF THE INVENTION

Selective epitaxial growth (SEG) of silicon and silicon-germanium alloy layers can be used in both CMOS and bipolar semiconductor devices. In the SEG method, the epitaxial layer is selectively grown only on an exposed silicon surface and not on the field area of the device. This selective deposition results in a device structure having fine dimensional isolation with high aspect ratio geometry and small effective channel-width deviation from the design width. As a result, reduction of chip size and area (with CMOS devices) is achieved.

Known methods of selectively growing epitaxial silicon layers involve using a masking layer, generally silicon dioxide, to prevent growth of the epitaxial layer on the field areas. A number of methods are known for selectively growing epitaxial silicon with respect to silicon dioxide using $SiH_2Cl_2/HCl$ or $SiCl_4/H_2$ chemistry with either atmospheric or low pressure chemical deposition techniques.

In all of the known methods, however, the process temperature for the epitaxial layer deposition is always in the range of 650° to 1100° C. These high temperatures cause problems such as greater stress, silicon warping, deformation of fine structures, degradation of doping profile, and overall thermal degradation of the semiconductor device. As understood, no such process is presently known for the selective growth of an epitaxial silicon layer at temperatures below 650° C.

SUMMARY OF THE INVENTION

An epitaxial layer is selectively grown on a semiconductor substrate or wafer by forming over the wafer a thin film masking layer of an oxide of an element selected from the group consisting of scandium, yttrium, lanthanum, cerium, praseodymium, neodymium, samarium, europium, gadolinium, terbium, dysprosium, holmium, erbium, thulium, ytterbium, and lutetium. The epitaxial layer is then grown over the wafer at temperatures below 650° C., but it does not grow on the masking layer.

DETAILED DESCRIPTION

Figure 3:
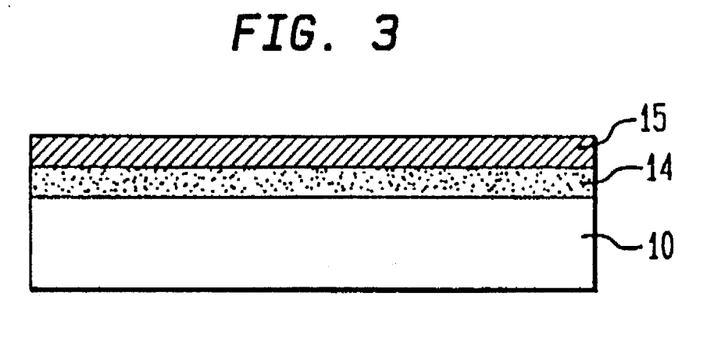
FIG. 3 is a cross sectional view illustrating low temperature polycrystalline growth on an intermediate layer on a semiconductor wafer.
Figure 4:
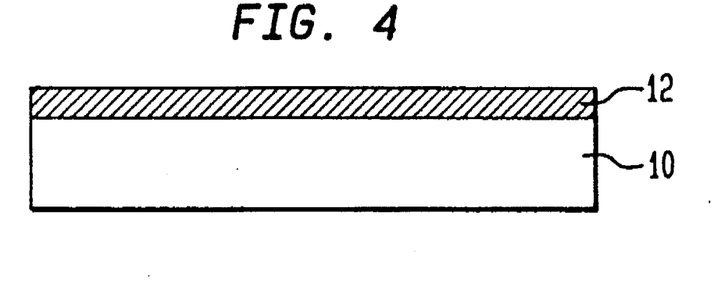
FIG. 4 is a cross sectional view illustrating low temperature epitaxial growth on a semiconductor wafer.

An exemplary embodiment of the present invention will now be described more fully with reference to the accompanying figures, in which growth of an epitaxial layer is illustrated and analyzed. FIGS. 1(a)–1(d) and 2 (a)–2(c) illustrate the effectiveness of an exemplary masking layer according to the present invention to produce selective epitaxial growth at low temperature (below 650° C.) except in FIG. 2 which shows a polycrystalline growth. FIGS. 3 and 4 illustrate low temperature polycrystalline growth over an intermediate layer on a semiconductor substrate or wafer and epitaxial growth on the semiconductor wafer itself. These Figures are purely schematic and are not drawn to scale. FIGS. 5(a), 5(b), 6(a), and 6(b) are analyses of the structures illustrated in the other figures.

An epitaxial layer can be selectively grown on a semiconductor substrate or wafer at low temperature in accordance with an exemplary embodiment of the present invention, in the following manner.

Figure 1A:
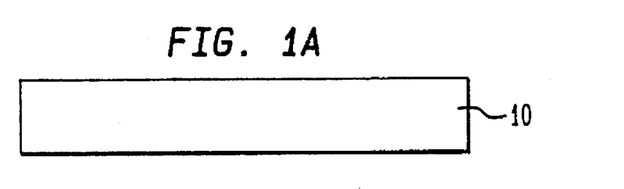
FIGS. 1(a)–1(d) are cross sectional views illustrating selective low temperature epitaxial growth on a semiconductor wafer using an exemplary masking material of the present invention.

As shown in FIG. 1(a), the starting material is a semiconductor substrate or wafer 10. This wafer may be a material such as silicon, silicon carbide, germanium, and compounds and alloys thereof. It will be understood that the exact size and shape of the substrate or wafer is not of critical importance and may be selected to permit the formation thereon of the desired number of circuit elements.

Figure 1B:
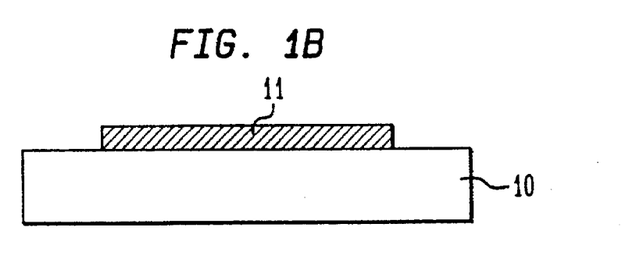
Figure 1C:
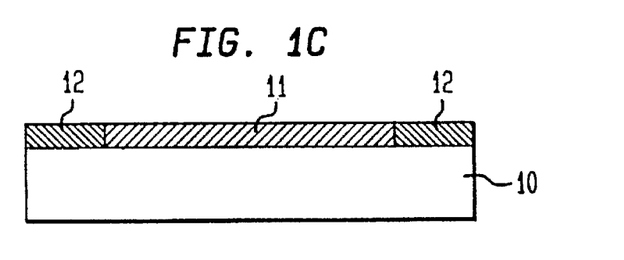

A masking layer 11, e.g. yttrium oxide ($Y_2O_3$) is deposited over wafer 10 in a desired pattern as shown in FIG. 1(b). The oxide deposition can be accomplished by known physical vapor deposition techniques such as sputtering, or by known chemical vapor deposition techniques, and any desired pattern can be generated using lithography (optical or e-beam).

Figure 1D:
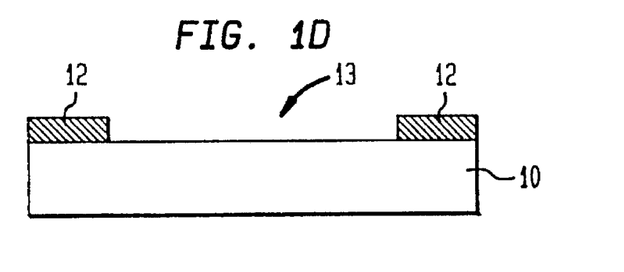

An epitaxial layer 12, e.g. silicon, is grown over wafer 10 with patterned oxide masking layer 11. Epitaxial layer 12 (FIG. 1(c)), which may also be a silicon-germanium alloy, is grown by chemical vapor growth techniques. The deposition is carried out at temperatures below 650° C. U.S. Pat. No. 5,298,452, which is assigned to the same assignee as this application and is incorporated into this application by reference, describes a process for low temperature epitaxial deposition of silicon layers. A technique such as RBS or optical micrography can be used to confirm that epitaxial layer 12 does not grow on oxide masking layer 11. Oxide masking layer 11 is then etched off, using for example an $HCl:H_2O$ solution, to yield exemplary desired structure 13 as shown in FIG. 1(d).

Figure 2A:
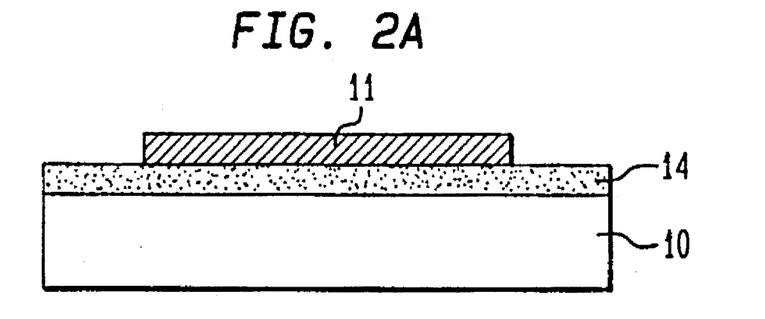
FIGS. 2(a)–2(c) are cross sectional views illustrating selective low temperature polycrystalline growth on an intermediate layer on a semiconductor wafer using an exemplary masking material of the present invention.

Oxide masking layer 11 is also an effective masking layer over intermediate layer 14, e.g. a dielectric material such as silicon dioxide ($SiO_2$) or ($Si_3N_4$), formed on semiconductor wafer 10, as shown in FIG. 2(a). Intermediate layer 14 can be formed using techniques well-known in the art that need not be described in detail.

Figure 2B:
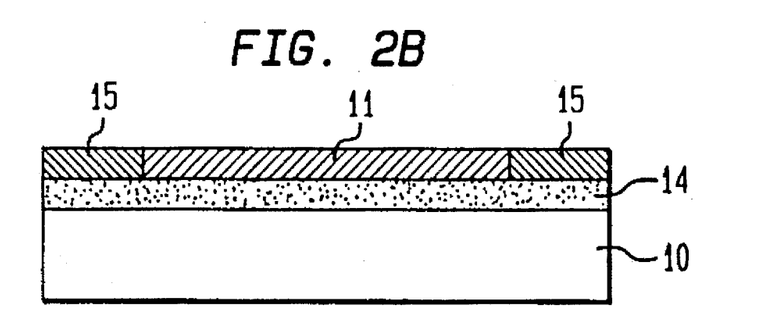

Oxide masking layer 11, e.g. $Y_2O_3$, is patterned over intermediate layer 14 according to the same techniques described above. Subsequently, as shown in FIG. 2(b), polycrystalline layer 15, e.g. silicon, is deposited over the structure shown in FIG. 2(a). Although some lateral overgrowth of polycrystalline layer 15 across oxide masking layer 11 is observed, RBS and optical micrography confirm that polycrystalline layer 15 in fact grows selectively; that is, it does not grow on oxide masking layer 11. Oxide masking layer 11 is then etched off as above to yield the structure shown in FIG. 2(c).

As shown in FIG. 3, under the same epitaxial deposition conditions described above, at temperatures below 650° C., polycrystalline layer 15 does grow on intermediate layer 14 formed over wafer 10 without masking layer 11. Although silicon dioxide acts as a masking material at temperatures above 650° C., at the lower temperature UHV-CVD process involved in this invention, polycrystalline growth occurs on the silicon dioxide. Similarly, epitaxial layer 12 grows on wafer 10 at the conditions described in this invention, and results in a structure as shown in FIG. 4.

EXAMPLE 1

A 100 nm thick $Y_2O_3$ film 11 was deposited on an 82 mm diameter <100> Si wafer 10 (FIG. 1). $Y_2O_3$ masking layer 11 was deposited using an MRC 643 side scan magnetron sputtering system from a planar oxide magnetron target. The base pressure of the MRC sputtering system was between 0.5 and 1×10E-7 Torr and the sputtering gas used was 99.9995% pure Ar mixed with 0.8–1.2% (99.995%) pure $O_2$. The gas composition was controlled with an optical gas analyzer. The $O_2$ was used to keep the $Y_2O_3$ target from becoming metallic. A radio frequency power of 1 KW was applied to the $Y_2O_3$ target giving a deposition rate of 1.33 nm per minute. The $Y_2O_3$ deposition temperature was kept below 250° C. RBS and XRD confirmed that $Y_2O_3$ film 11 was stoichiometric and crystalline.

Figure 5A:
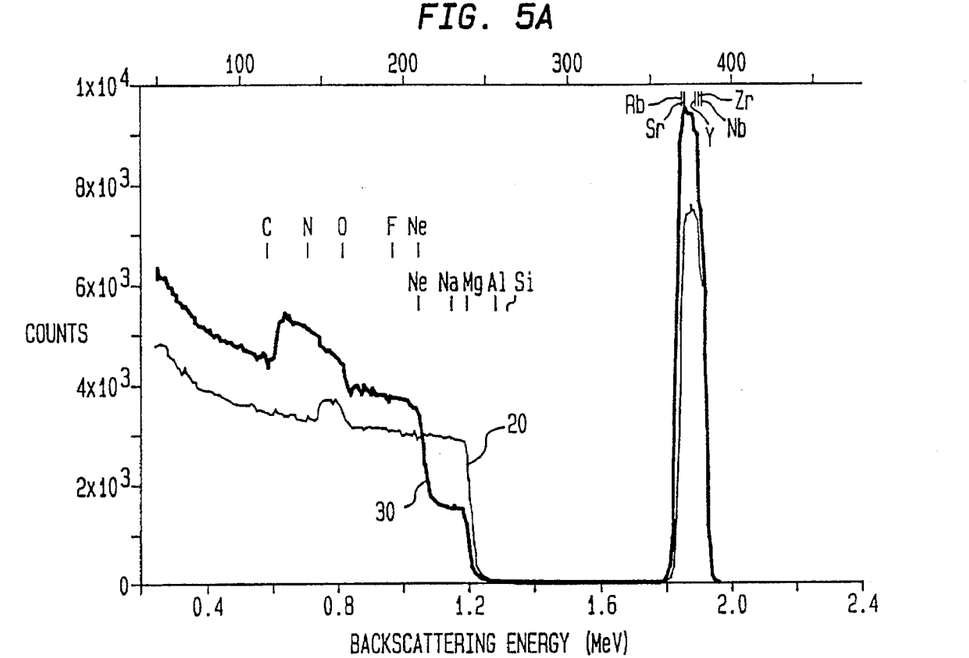
FIG. 5(a) is a Rutherford backscattering spectroscopy (RBS) plot of the examples illustrated in FIGS. 1(a)–1(d) and 2(a)–2(c).
Figure 5B:
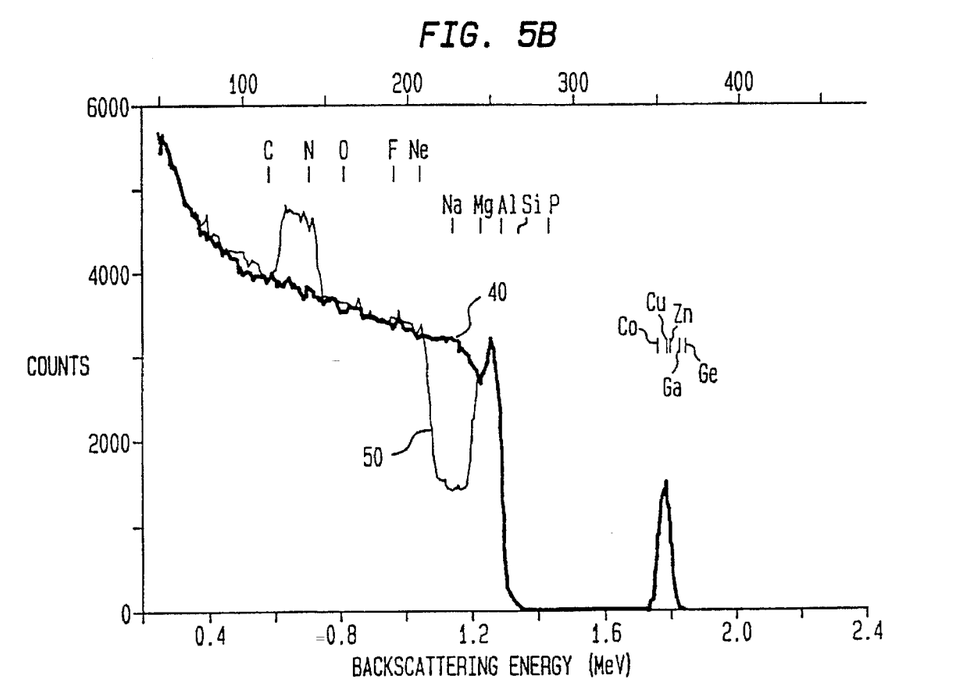
FIG. 5(b) is an RBS plot of the examples illustrated in FIGS. 3 and 4.

Silicon wafer 20 with $Y_2O_3$ layer 11 was then given an HF dip and placed in an ultra high vacuum chemical vapor deposition (UHV-CVD) reactor for Si and $Si_{0.9}Ge_{0.1}$ growth. One such reactor is described in U.S. Pat. No. 5,181,964, assigned to the same assignee as this application and incorporated into this application by reference. In the UHV-CVD reactor, the temperature was 550° C.; the pressure was 1 mTorr; the gas was a mixture of 100% silane at 1 sccm plus 10% Germane in He at 5 sccm; and the growth rate was in the range from 10–20 Å per minute and was practiced at 15 Å per minute. RBS was used to analyze the resultant structure. The results of this analysis, shown at 20 in FIG. 5(a), illustrate that no Si or $Si_{0.9}Ge_{0.1}$ nucleated and grew on $Y_2O_3$ film 11. An optical micrograph, 21 in FIG. 6(a), confirmed the absence of silicon on the $Y_2O_3$ layer.

EXAMPLE 2

Figure 2C:
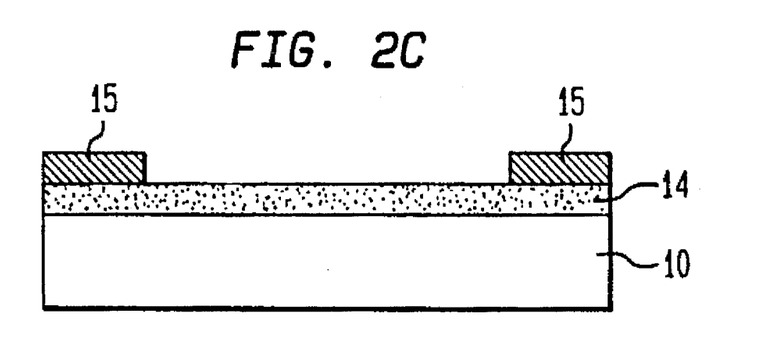

Using the same sputtering system as described above, a 100 nm thick $Y_2O_3$ film was deposited on an approximately 400 nm thick layer of $SiO_2$ formed by thermal oxidation on silicon wafer 10 (FIG. 2). The resultant structure was then placed in the UHV-CVD reactor for 140 nm $Si_{0.9}Ge_{0.1}$ growth followed by 100 nm Si growth. The same layer deposition conditions as described above were used in this example. Once again, RBS was used to analyze the resultant structure. As shown at 30 in FIG. 5(a), no Si or $Si_{0.9}Ge_{0.1}$ nucleated and grew on the $Y_2O_3$ film. An optical micrograph confirmed the absence of silicon (with the exception of some lateral overgrowth) as illustrated at 31 in FIG. 6(a).

EXAMPLE 3

To illustrate the effectiveness of $Y_2O_3$ as a masking layer, a blanket Si wafer 10 was used as a control (FIG. 4). No $Y_2O_3$ layer was deposited on this substrate. After being given a HF dip, the Si wafer was exposed to UHV-CVD epitaxial growth of 140 nm $Si_{0.9}Ge_{0.1}$ followed by 100 nm Si growth. The conditions for this deposition were the same as those described in the examples above. RBS was used to determine that Si 100 nm thick and $Si_{0.9}Ge_{0.1}$ 140 nm thick in fact nucleated and grew on the Si substrate, as shown at 40 in FIG. 5(b). An optical micrograph confirmed the growth of epitaxial silicon on the silicon as shown at 41 in FIG. 6(a).

EXAMPLE 4

As another control, Si wafer 10 with a 400 nm thick layer of $SiO_2$ 14 (FIG. 3) formed thereon was subjected to UHV-CVD deposition of polycrystalline $Si_{0.9}Ge_{0.1}$ and Si growth. The conditions were the same for this deposition as those described in the examples above. RBS was used to analyze the resulting structure and determined that polycrystalline Si 100 nm thick and $Si_{0.9}Ge_{0.1}$ 140 nm thick did in fact nucleate and grow on $SiO_2$ layer 14. This is illustrated at 50 in FIG. 5(b). An optical micrograph confirmed the presence of polycrystalline silicon over the $SiO_2$ layer, as shown at 51 in FIG. 6(a).

Figure 6A:
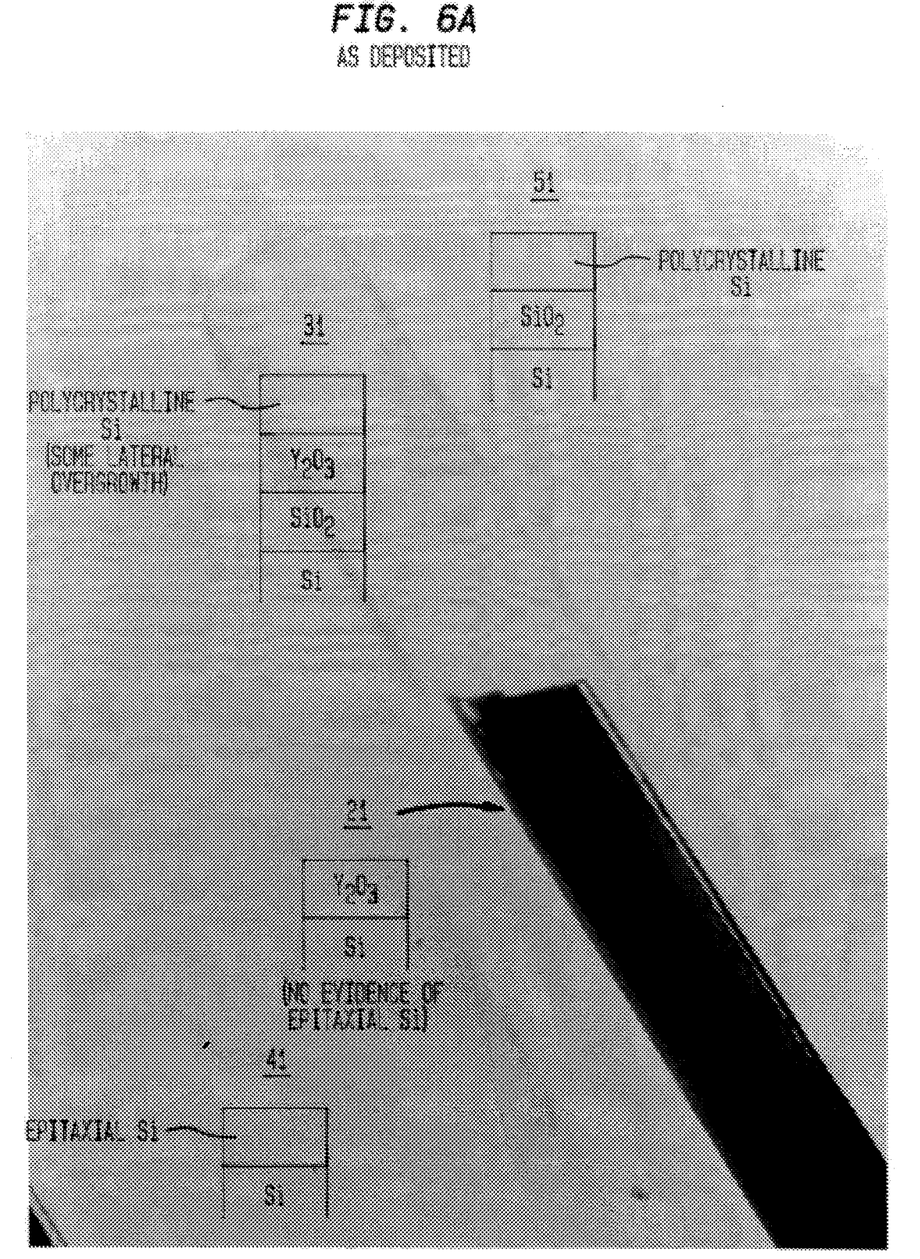
FIG. 6(a) is an optical micrograph of the examples illustrated in FIGS. 1(a)–1(d), 2(a)–2(c), 3, and 4 after deposition of the epitaxial or polycrystalline layer.
Figure 6B:
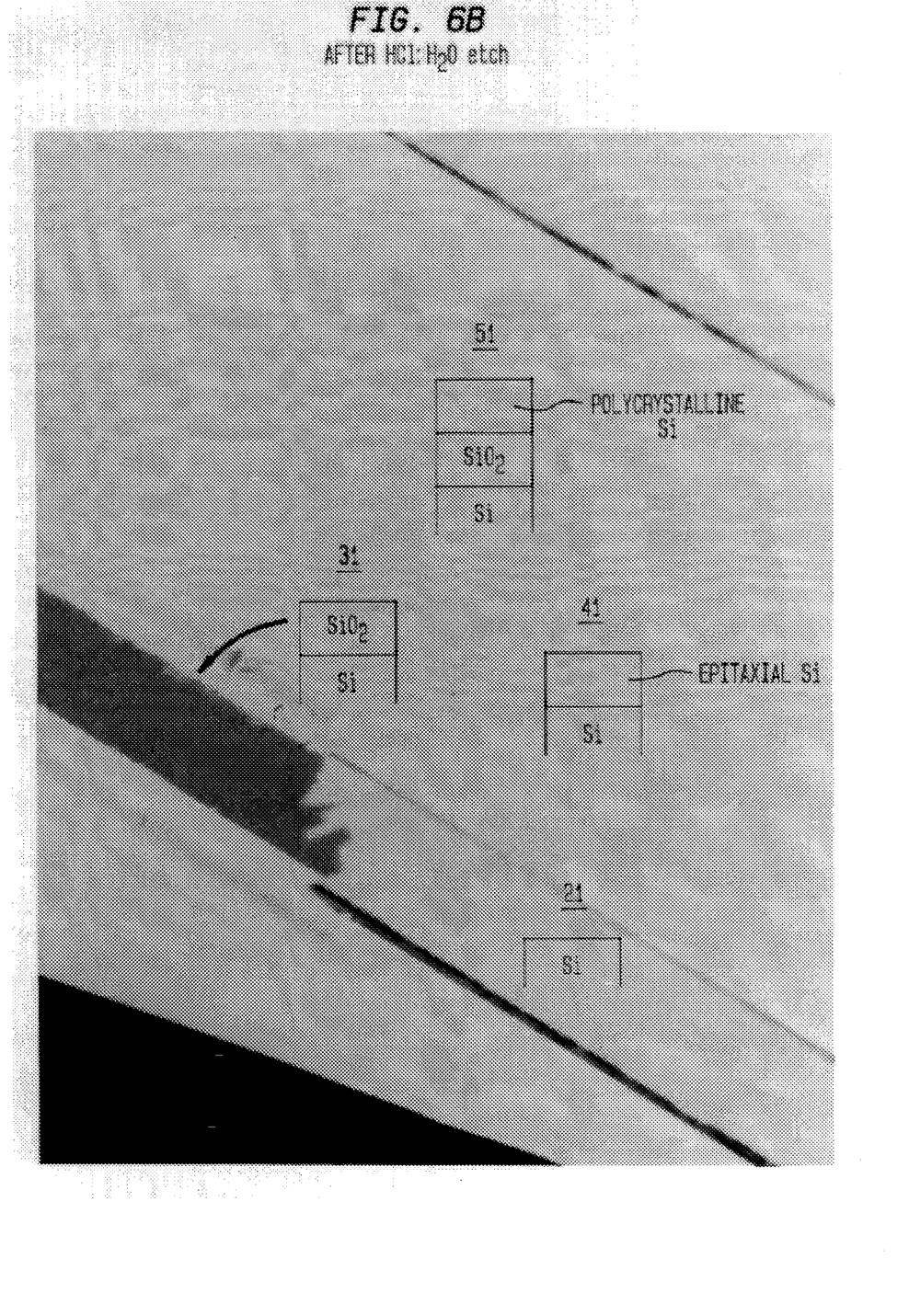
FIG. 6(b) is an optical micrograph of the examples illustrated in FIGS. 1(a)–1(d), 2(a)–2(c), 3, and 4 after an $HCl:H_2O$ etch used to remove the masking layer.

FIG. 6 (b) is an optical micrograph of the above examples 1–4 after the samples were etched by an $HCl:H_2O$ mixture. The $HCl:H_2O$ mixture does not etch silicon or silicon dioxide; it only attacks the $Y_2O_3$. The reference numerals in FIG. 6(b) correspond to those in FIG. 6(a) and refer to the same examples. As can be seen, once the $Y_2O_3$ layer was etched off, at 21 only the original silicon substrate remains while at 31, only the $SiO_2$ layer remains. The fact that the $Y_2O_3$ layer was so easily etched off of the $SiO_2$ layer at 31 is believed to prove that any polycrystalline Si that was observed over the $Y_2O_3$ layer was lateral overgrowth resulting from the growth of polycrystalline Si on the $SiO_2$ layer. This is because this overgrowth area was easily undercut using the etch to remove the $Y_2O_3$ and expose the $SiO_2$.

The above examples were repeated on 125 mm diameter <100> Si and thermally oxidized <100> Si wafers. The same results for each example as reported above were achieved on these substrates.

Because yttrium is a Group IIIB element, and the Group IIIB elements, as well as the rare earth elements, all exhibit similar properties, it is reasonable to conclude that all Group IIIB oxides and rare earth oxides will act as a masking material for the selective growth of UHV-CVD epitaxial layers at temperatures below 650° C. The oxides of all of these elements are thus within the scope of the present invention, with the exception of actinium oxide and promethium oxide since actinium and promethium are radioactive. The following prophetic examples are submitted as disclosure of the other elements.

PROPHETIC EXAMPLE 1

$Sc_2O_3$ is patterned on a semiconductor substrate for example silicon in accordance with the sputtering technique described in the above examples. After an HF dip, the wafer with the $Sc_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Sc_2O_3$ layer.

PROPHETIC EXAMPLE 2

$La_2O_3$ is patterned on a semiconductor substrate for example silicon in accordance with the sputtering technique described in the above examples. After an HF dip, the wafer with the $La_2O_3$ masking layer is then placed in a UHV-CVD reactor for epitaxial 140 nm $Si_{0.9}Ge_{0.1}$ growth followed by 100 nm Si growth under the same conditions as those described in the above examples. RES and optical micrographs would confirm that there is no nucleation or growth of epitaxial Si or $Si_{0.9}Ge_{0.1}$ on the $La_2O_3$ layer.

PROPHETIC EXAMPLE 3

$CeO_2$ is patterned on a semiconductor substrate for example silicon in accordance with the sputtering technique described in the above examples. After an HF dip, the wafer with the $CeO_2$ masking layer is then placed in a UHV-CVD reactor for epitaxial 140 nm $Si_{0.9}Ge_{0.1}$ growth followed by 100 nm Si growth under the same conditions as those described in the above examples. RES and optical micrographs would confirm that there is no nucleation or growth of epitaxial Si or $Si_{0.9}Ge_{0.1}$ on the $CeO_2$ layer.

PROPHETIC EXAMPLE 4

$Pr_2O_3$ is patterned on a semiconductor substrate for example silicon in accordance with the sputtering technique described in the above examples. After an HF dip, the wafer with the $Pr_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Pr_2O_3$ layer.

PROPHETIC EXAMPLE 5

$Nd_2O_3$ is patterned on a semiconductor substrate for example silicon in accordance with the sputtering technique described in the above examples. After an HF dip, the wafer with the $Nd_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Nd_2O_3$ layer.

PROPHETIC EXAMPLE 6

$Sm_2O_3$ is patterned on a semiconductor substrate for example silicon in accordance with the sputtering technique described in the above examples. After an HF dip, the wafer with the $Sm_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Sm_2O_3$ layer.

PROPHETIC EXAMPLE 7

$Eu_2O_3$ is patterned on a semiconductor substrate for example silicon in accordance with the sputtering technique described in the above examples. After an HF dip, the wafer with the $Eu_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Eu_2O_3$ layer.

PROPHETIC EXAMPLE 8

$Gd_2O_3$ is patterned on a semiconductor substrate for example silicon in accordance with the sputtering technique described in the above examples. After an HF dip, the wafer with the $Gd_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Gd_2O_3$ layer.

PROPHETIC EXAMPLE 9

$Tb_2O_3$ is patterned on a semiconductor substrate for example silicon in accordance with the sputtering technique described in the above examples. After an HF dip, the wafer with the $Tb_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Tb_2O_3$ layer.

PROPHETIC EXAMPLE 10

$Dy_2O_3$ is patterned on a semiconductor substrate for example silicon in accordance with the sputtering technique described in the above examples. After an HF dip, the wafer with the $Dy_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the by $Dy_2O_3$ layer.

PROPHETIC EXAMPLE 11

$Ho_2O_3$ is patterned on a semiconductor substrate for example silicon in accordance with the sputtering technique described in the above examples. After an HF dip, the wafer with the $Ho_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $HO_2O_3$ layer.

PROPHETIC EXAMPLE 12

$Er_2O_3$ is patterned on a semiconductor substrate for example silicon in accordance with the sputtering technique described in the above examples. After an HF dip, the wafer with the $Er_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Er_2O_3$ layer.

PROPHETIC EXAMPLE 13

$Tm_2O_3$ is patterned on a semiconductor substrate for example silicon in accordance with the sputtering technique described in the above examples. After an HF dip, the wafer with the $Tm_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Tm_2O_3$ layer.

PROPHETIC EXAMPLE 14

$Yb_2O_3$ is patterned on a semiconductor substrate for example silicon in accordance with the sputtering technique described in the above examples. After an HF dip, the wafer with the $Yb_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Yb_2O_3$ layer.

PROPHETIC EXAMPLE 15

$Lu_2O_3$ is patterned on a semiconductor substrate for example silicon in accordance with the sputtering technique described in the above examples. After an HF dip, the wafer with the $Lu_2O_3$ masking layer is then placed in a UHV-CVD reactor for epitaxial 140 nm $Si_{0.9}Ge_{0.1}$ growth followed by 100 nm Si growth under the same conditions as those described in the above examples. RBS and optical micrographs would confirm that there is no nucleation or growth of epitaxial Si or $Si_{0.9}Ge_{0.1}$ on the $Lu_2O_3$ layer.

While this invention has been described in terms of exemplary embodiments, it is contemplated that it may be practiced as outlined above with modifications within the spirit and scope of the appended claims.

What is claimed:

1. A semiconductor device manufactured according to the process of:
   (a) forming over a substrate a masking layer of an oxide of an element selected from the group consisting of scandium, yttrium, lanthanum, cerium, praseodymium, neodymium, samarium, europium, gadoliunium, terbium, dysprosium, holmium, erbium, thulium, ytterbium, and lutetium; and
   (b) growing an epitaxial layer over said substrate at a temperature below 650° C., wherein said epitaxial layer does not grow on said masking layer.

2. A semiconductor device manufactured according to the process of:
   a depositing an intermediate layer over a substrate;
   (b) forming over said intermediate layer a masking layer of an oxide of an element selected from the group consisting of scandium, yttrium, lanthanum, cerium, praseodymium, neodymium, samarium, europium, gadolinium, terbium, dysprosium, holmium, erbium, thulium, ytterbium, and lutetium; and
   (c) growing a polycrystalline layer over said substrate at a temperature below 650° C., wherein said polycrystalline layer does not grow on said masking layer.

3. A semiconductor device manufactured according to the process of:
   (a) forming over a substrate a masking layer of an oxide of an element selected from the group consisting of scandium, yttrium, lanthanum, cerium, praseodymium, neodymium, samarium, europium, gadoliunium, terbium, dysprosium, holmium, erbium, thulium, ytterbium, and lutetium;
   (b) growing an epitaxial layer over said substrate at a temperature below 650° C., wherein said epitaxial layer does not grow on said masking layer; and
   (c) etching off said masking layer.

4. A semiconductor device manufactured according to the process of:
   (a) depositing an intermediate layer over a substrate;
   (b) forming over a substrate a masking layer of an oxide of an element selected from the group consisting of scandium, yttrium, lanthanum, cerium, praseodymium, neodymium, samarium, europium, gadoliunium, terbium, dysprosium, holmium, erbium, thulium, ytterbium, and lutetium;
   (c) growing an epitaxial layer over said substrate at a temperature below 650° C., wherein said epitaxial layer does not grow on said masking layer; and
   (d) etching off said masking layer.

5. A semiconductor device as claimed in claim 4 wherein said substrate is silicon carbide and said polycrystalline layer is silicon germanium.

6. A semiconductor device as claimed in claim 3 wherein said substrate is silicon carbide and said epitaxial layer is silicon germanium.

* * * * *